United States Patent [19]

Inoue et al.

[11] Patent Number: 5,304,461
[45] Date of Patent: Apr. 19, 1994

[54] PROCESS FOR THE SELECTIVE DEPOSITION OF THIN DIAMOND FILM BY GAS PHASE SYNTHESIS

[75] Inventors: Takayoshi Inoue; Hiroyuki Tachibana; Akimitsu Nakaue; Kazuo Kumagai; Koichi Miyata, all of Kobe; Koji Kobashi, Nishinomiya, all of Japan

[73] Assignee: Kabushiki Kaisha Kobe Seiko Sho, Kobe, Japan

[21] Appl. No.: 845,790

[22] Filed: Mar. 9, 1992

Related U.S. Application Data

[63] Continuation of Ser. No. 462,548, Jan. 9, 1990, abandoned.

[30] Foreign Application Priority Data

Jan. 10, 1989 [JP] Japan ............................. 1-4092
Dec. 11, 1989 [JP] Japan ........................... 1-322259

[51] Int. Cl.$^5$ ............................................. G03C 5/00
[52] U.S. Cl. .................................... 430/323; 430/314; 148/33.4; 437/100; 437/103; 437/165; 427/585
[58] Field of Search ............... 430/323, 314; 148/33.4, 148/33.3; 437/100, 103, 165; 427/585

[56] References Cited

U.S. PATENT DOCUMENTS

| | | | |
|---|---|---|---|
| 4,278,710 | 7/1981 | Jelks | 427/250 |
| 4,536,469 | 8/1985 | Alderstein | 430/314 |
| 4,806,900 | 2/1989 | Fujimori et al. | |
| 4,816,291 | 3/1989 | Desphandey et al. | 437/38 |
| 4,863,529 | 3/1988 | Imai et al. | 148/33.4 |
| 5,006,914 | 3/1991 | Beetz, Jr. | 357/61 |
| 5,082,359 | 1/1992 | Kirkpatrick | 427/585 |

FOREIGN PATENT DOCUMENTS 0070295A 3/1987 Japan.
281359 5/1989 Japan.
2183090 5/1987 United Kingdom.

*Primary Examiner*—Marion E. McCamish
*Assistant Examiner*—S. Rosasco
*Attorney, Agent, or Firm*—Oblon, Spivak, McClelland, Maier & Neustadt

[57] ABSTRACT

Thin diamond films can be selectively deposited imagewise on a substrate by gas phase synthesis. The substrate may be either a silicon substrate or a basal thin diamond film formed beforehand on a substrate by gas phase synthesis. Where a silicon substrate is used, its surface is first abraded to give a surface roughness suitable for gas phase synthesis of diamond. When a basal thin diamond film is used, a coating material capable of withstanding a temperature higher than a substrate temperature required for gas phase synthesis of diamond and having a high etching selectivity to diamond is needed to cover areas other than where the thin diamond film is to be newly formed. When a lift-off method is used, a thin masking film having a melting point higher than a temperature to be employed for gas phase synthesis of diamond can also be used in place of the coating material described above.

11 Claims, 4 Drawing Sheets

PROCESS FOR THE SELECTIVE DEPOSITION OF THIN DIAMOND FILM BY GAS PHASE SYNTHESIS

This application is a continuation of application Ser. No. 07/462,548, filed on Jan. 9, 1990, now abandoned.

BACKGROUND OF THE INVENTION

1. Field of the Invention

The present invention relates to a process for the selective deposition of thin diamond films by gas phase synthesis, and specifically to a process for selectively growing by gas phase synthesis thin diamond films on desired areas of a silicon substrate or on desired areas of a surface of a basal thin diamond film formed beforehand on a desired substrate by gas phase synthesis. This process is useful for the development of new devices and materials in the semiconductor field, the Electronic fields, and the like.

2. Discussion of the Background

It has been known that a thin diamond film can be formed on a substrate by gas phase synthesis, namely, by using as a raw material a gas mixture of a hydrocarbon gas, such as methane, and a hydrogen gas, and by subjecting it to cracking or plasma reaction in a vacuum chamber. A variety of processes has been proposed to practice this technique. It has now been recognized by identification characterization of various properties such as crystallinity, the directionality of crystalline growth and thermal conductivity that various thin diamond films so formed by gas phase synthesis have properties identical to natural diamond.

As examples of potential application fields making use of such properties of thin diamond films formed by gas phase synthesis, various attempts have heretofore been made to use them as abrasive coatings for cemented carbide (WC) tools, heat sinks for ICs, coatings for speaker diaphragms and so on. In such applications, it is required to deposit thin diamond films uniformly on substrates or base materials. Accordingly, selective deposition has not been attempted at all.

As a further example of an application field of the thin film technology, there is the semiconductor field. This field is considered to have the greatest future prospect and development as an application field of thin diamond films. Current semiconductors are mainly Si semiconductors which employ a silicon wafer as a substrate. If it becomes feasible to form a thin diamond film on a silicon wafer and further to form the thin diamond film as a fine pattern on the order of micrometers by selective deposition, it will be possible to use thin diamond films as heat sinks for certain specific elements of integrated circuits, as insulators between circuit wirings in integrated circuits, in high performance devices fabricated by hybridization of Si and thin diamond films, as optical waveguides using thin diamond films, and the like.

Under the current level of technology for depositing a thin diamond film on a silicon substrate, it is essential as shown in FIGS. 4(a) to 4(c) to abrade a surface of a silicon wafer 1 with diamond powder or paste of a particle size on the order of several micrometers to provide an abraded wafer 1' having a number of scratches 21 in the surface and then to deposit a thin diamond film 22 thereon by gas phase synthesis. Owing to the existence of the surface scratches 21, the diamond nucleation density is increased substantially so that the thin diamond film 22 can be obtained as a continuous polycrystalline thin diamond film. If the above abrasion were not applied, no diamond would practically be formed on the silicon wafer. On the contrary, the abrasion results in uniform formation of diamond particles on the surface of the silicon wafer, whereby diamond eventually grows into a continuous film. It is therefore impossible to form a circuit or pattern, which has a desired configuration, with a thin diamond film.

As is known very well, diamond has the highest hardness among all the materials and also has a high thermal conductivity and excellent heat resistance and radiation resistance. Using gas-phase-synthesized diamond, the development of environment-resistant electronic devices, semiconductor devices and the like, which are equipped with such attractive properties, are now under way.

For the application of gas-phase-synthesized diamond in the field of such electronic technology, there has been an outstanding demand for the development of a technique for permitting selective formation or deposition of thin diamond films on desired areas of a surface of silicon substrate or wafer. With a view toward meeting this demand, the present assignee has proposed the following process for the gas phase synthesis of diamond (Japanese Patent Application Laid-Open No. 297298/1987).

Namely, prior to gas phase synthesis of diamond on a silicon substrate, desired areas of a surface of the substrate, on which diamond is to be deposited, are selectively covered with a masking material. The remaining areas other than those covered with the masking material are coated with an amorphous material such as amorphous silicon. The masking material is then stripped off to expose the surface of the substrate, followed by the application of gas phase synthesis thereby to deposit a thin diamond film on the thus-exposed surface areas of the substrate.

Since the above technique has made it possible to form a thin diamond film on a surface of a silicon substrate in accordance with a desired pattern, trial fabrication of diamond semiconductors and the like has been further facilitated.

The above technique has however been found to involve such problems that when a silicon substrate is used as a basal substrate, the maximum breakdown voltage of the resulting device is governed by silicon as the basal substrate and the device is prone to damages due to the difference in thermal expansion coefficient between silicon and diamond when used at elevated temperatures.

If a technique can be established to permit the deposition of an additional thin diamond film in accordance with a desired pattern by gas phase synthesis on a surface of a basal thin diamond film formed beforehand on a silicon substrate by gas phase synthesis, the above-described problems can be solved by etching off the silicon substrate alone, if necessary, after forming a semiconducting device on the basis of such a technique.

SUMMARY OF THE INVENTION

An object of the present invention is to provide a solution to the problem that the conventional processes cannot selectively deposit a thin diamond film on the order of micrometers in the form of a pattern or circuit although they can uniformly deposit a thin diamond film on a silicon substrate or another base material.

Another object of the present invention is to provide a process for the selective deposition of thin diamond films by gas phase synthesis, which permits the deposition of a new thin diamond film in accordance with a desired pattern by gas phase synthesis on a surface of a basal thin diamond film formed beforehand on a desired substrate by gas phase synthesis.

In a first embodiment of the present invention, there is thus provided a process for the selective imagewise deposition of thin diamond films on a silicon substrate by gas phase synthesis, which includes the steps of:

i) abrading a surface of the silicon substrate to give scratches suited for gas phase synthesis of diamond thereon;

ii) coating a uniform photoresist layer on the thus-abraded surface;

iii) exposing the photoresist layer imagewise to radiation;

iv) developing the thus-exposed photoresist layer, whereby exposed areas and unexposed areas are distinguished from each other and the photoresist layer is eliminated at the exposed or unexposed areas;

v) subjecting the surface of the silicon substrate at the areas, where the photoresist layer has been eliminated, to reactive ion etching by a gas mixture discharge of $CF_4$, Ar and $O_2$;

vi) washing off any remaining photoresist layer; and vii) carrying out gas phase synthesis of diamond by using the silicon substrate processed through the preceding steps i) to vi).

According to the above embodiment of the present invention, the surface abraded in step i) is exposed in step vi) only in the form of a circuit, a pattern or the like baked in the photoresist in step iv). A thin diamond film is deposited on the thus-exposed surface areas in step vii), so that the circuit, pattern or the like can be formed on the order of micrometers. Further, the reactive ion etching (RIE) of the silicon substrate by the gas mixture discharge of $CF_4$, Ar and $O_2$ in step v) permits the deposition of a thin diamond film in the desired pattern with good selectivity.

In a second embodiment of the present invention, there is also provided a process for the selective imagewise deposition of new thin diamond films by gas phase synthesis on a surface of a basal thin diamond film formed beforehand on a substrate by gas phase synthesis, which includes the steps of:

i) coating predetermined areas of the surface of the basal thin diamond film, said predetermined areas being other than specific areas where the newly-grown thin diamond film is to be formed, with a material capable of withstanding a temperature higher than a substrate temperature required for gas phase synthesis of diamond and having a high etching selectivity to diamond; and ii) carrying out gas phase synthesis of diamond so as to form thin diamond films on the specific areas of the basal thin diamond film.

In a third embodiment of the present invention, there is also provided a process for the selective imagewise deposition of new thin diamond films by gas phase synthesis on a surface of a basal diamond film formed beforehand on a non-diamond substrate, which includes the steps of:

i) partly masking the surface of the basal diamond films with thin masking films having a melting point higher than a temperature to be employed for gas phase synthesis of diamond; and ii) depositing diamond on unmasked areas of the surface of the basal diamond film by gas phase synthesis.

In the processes of the second and third embodiments of the present invention for the selective deposition of a thin diamond film by gas phase synthesis, the probability of nucleation of diamond particles is extremely low at the areas covered or masked with the material capable of withstanding a temperature higher than the substrate temperature required for gas phase synthesis of diamond and having a high etching selectivity to diamond or with the thin masking film having a melting point higher than a temperature to be employed for gas phase synthesis of diamond, in other words, in the areas where the deposition of a new thin diamond film is not desired, so that the deposition of a thin diamond film is highly inhibited there. This allows deposition of new thin diamond films in desired areas on the surface of the basal thin diamond film. Even if some diamonds on the surface of the coating or masking films of the above-described material, the bonding of the diamond film is extremely weak so that these diamond film can be easily removed. Thus, such diamond films do not give any inconvenience for the achievement of the objects of the invention.

According to the processes of the second and third embodiments of the present invention, new thin diamond films can be deposited at desired areas on the surface of a basal thin diamond film in accordance with the pattern of the desired areas.

Removal of only a silicon or like substrate, if necessary, after the fabrication of semiconducting devices in accordance with any of the above-described selective deposition processes according to the present invention allows the device to have the excellent characteristics of diamond. The present invention can therefore contribute to the development of electronic devices, equipped with the excellent performance since their maximum breakdown voltages have been improved significantly and the devices are free from the potential problem of damages at elevated temperatures due to the difference in thermal expansion coefficients.

BRIEF DESCRIPTION OF THE DRAWINGS

The above and other objects, features and advantages of the present invention will become apparent from the following description and the appended claims, taken in conjunction with the appended drawings, in which:

DESCRIPTION OF THE PREFERRED EMBODIMENTS

The material for coating the areas, in which deposition of new thin diamond films are not desired, in the process according to the second embodiment of the present invention has, as described above, the properties that it can suppress nucleation of diamond particles and it has a high etching selectivity to diamond. The term "high etching selectivity to diamond" as used herein means that upon eliminating of the coating material subsequent to the deposition of new thin diamond films on the basal thin diamond film, diamond is not adversely affected, for example, is not dissolved by a reagent, gas or the like to be employed to eliminate or otherwise remove the coating material. The coating material is required to withstand a temperature higher than the substrate temperature needed for the gas phase synthesis of diamond. This requirement is to prevent any deformation of the coating film, which defines the shape or pattern of thin diamond films to be deposited newly, when the substrate is heated upon formation of diamond by gas phase synthesis. Incidentally, in the gas phase synthesis of diamond, for example, by a microwave plasma CVD process, the gas phase synthesis of diamond is conducted by maintaining the substrate temperature around 800° C.

Exemplary materials possessing such properties include amorphous ceramics such as amorphous silicon, silicon oxide and silicon nitride, microcrystalline silicon, and the like. Of these, amorphous silicon is preferred from the standpoint of ease of in coating.

in the process according to the second embodiment of the present invention, new thin diamond films are grown with a larger grain size compared to the grain size of the basal thin diamond film. The thin diamond film as the basal layer is formed, for example, on a silicon substrate whose surface has been buffed with a diamond paste, so that the initial nucleation density is high and crystal grains are small in the initial stage of the growth. As diamond crystals grow, they mutually undergo competitive growth so that the crystal density decreases and crystal grains become larger. On the other hand, new thin diamond films grow epitaxially on the basal thin diamond film, so that the newly-grown thin diamond films have large crystal grains. Although the controllability is poor, it is desired to use a fast film-forming process upon gas phase synthesis of the basal thin diamond film. When new thin diamond films are overlayed on the basal thin diamond film by gas phase synthesis, new thin diamond films may be allowed to slowly grow with good controllability because a large thickness is usually not needed.

The following specific examples are presented to illustrate embodiments of the invention, but it is to be understood that the invention is not limited thereto.

EXAMPLE 1

A first embodiment of the process of the present invention will hereinafter be described with reference to FIGS. 1(a) to 1(g).

Figure 1A:
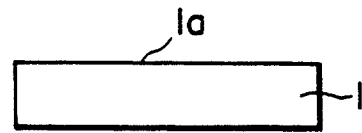
FIGS. 1(a) to 1(g) schematically illustrate various steps of a first embodiment of the process according to the present invention and partly fabricated products, in the order of the steps which are carried out as indicated by arrows.

In step i), one side of a 20×10 mm silicon wafer 1 of n-type Si(111) by way of example is buffed for 1 hour with a diamond paste having a grain size of ¼ μm, thereby forming an abraded surface 1a [FIG. 1(a)].

Figure 1B:
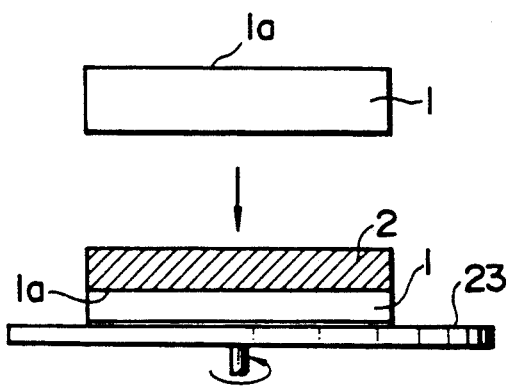
Figure 1C:
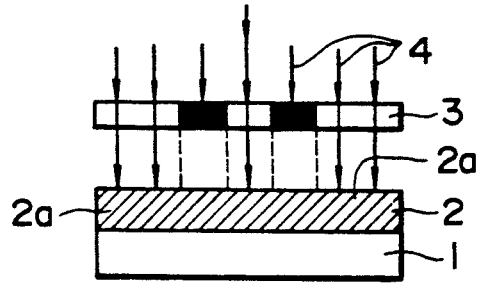

In step ii), a positive photoresist film 2 is formed on the abraded surface 1a of the thus-buffed silicon wafer 1 by means of a spinner 23 [FIG. 1(b)].

The silicon wafer 1 thus coated is next subjected to pre-baking to evaporate organic solvent from the photoresist film 2.

In step iii), the photoresist film 2 is exposed to ultraviolet rays 4 through a photomask 3 which bears a circuit or a pattern. Exposed resist portions 2a are sensitized and softened [FIG. 1(c)].

Figure 1D:
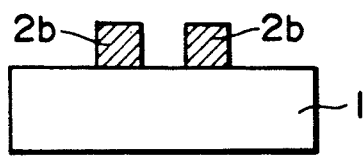

In step iv), the softened resist portions 2a are eliminated with a developer, whereby unexposed resist portions 2b remain on the silicon wafer 1 [FIG. 1(d)].

Post-baking is next conducted to solidify the remaining resist portions 2b.

Figure 1E:
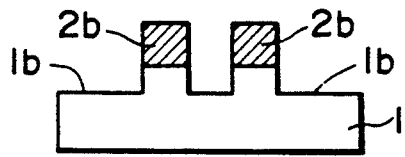
Figure 1F:
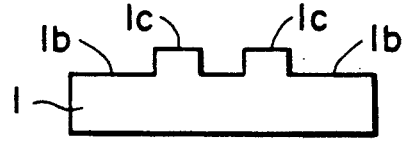

In step v), the exposed portions of the abraded surface 1a of the silicon wafer 1, said exposed portions being not covered with the resist portions 2b, are subjected to etching in an unillustrated plasma etching apparatus, thereby forming etched surface portions 1b [FIG. 1(e)]. A mixed gas of $CF_4$, $O_2$ and Ar is used as a reaction gas.

In step vi), the remaining resist portions 2b are eliminated by a mixed solution of sulfuric acid and hydrogen peroxide. As a result, remaining abraded surface portions 1c other than the etched surfaces portions 1b are exposed in a pattern conforming with the circuit or pattern referred to above [FIG. 1(f)].

Figure 1G:
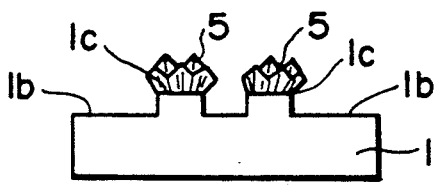

In step vii), using an unillustrated gas phase diamond deposition apparatus (microwave plasma CVD apparatus, hot filament CVD apparatus or the like), gas phase synthesis of diamond is carried out on the silicon wafer substrate [FIG. 1(g)]. When a microwave plasma CVD apparatus is used, the gas phase synthesis can be carried out using a 1.0% $CH_4$ concentration, 31.5 Torr gas pressure and 800° C. substrate temperature. It takes about 3.5 hours until new thin diamond films are deposited to a desired thickness.

As schematically depicted in FIG. 1(g), diamond is allowed to selectively grow only on the abraded portions 1c in the form of the circuit or pattern so that the desired pattern of thin diamond films (5) are formed.

EXAMPLE 2

A second embodiment of the process of the present invention will next be described with reference to FIG. 2(a) to 2(e). One side of a silicon substrate 1 of desired dimensions is buffed beforehand with a diamond paste. Using a microwave plasma CVD apparatus, a basal thin diamond film 6 is formed as an undercoat to a thickness of 5 μm. The present embodiment will hereinafter be described in the order of the steps thereof.

Figure 2A:
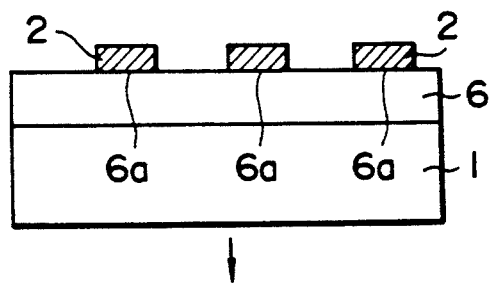
FIGS. 2(a) to 2(e) schematically depict various steps of a second embodiment of the process according to the present invention and partly fabricated products, in the order of the steps which are conducted as indicated by arrows.

(1) First, surface areas 6a of the basal thin diamond film 6, where diamond is to be formed newly, are coated with photoresist layers 2 to a thickness of about 1 μm by a known lithographic technique [FIG. 2(a)].

Figure 2B:
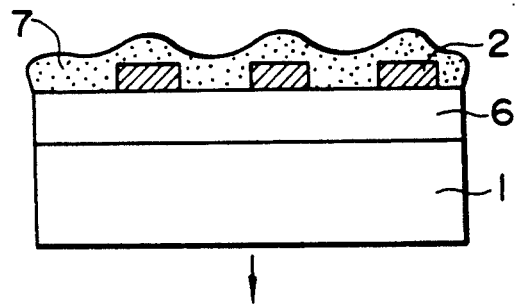
Figure 2C:
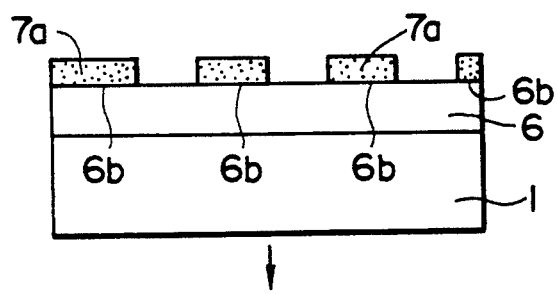
Figure 2D:
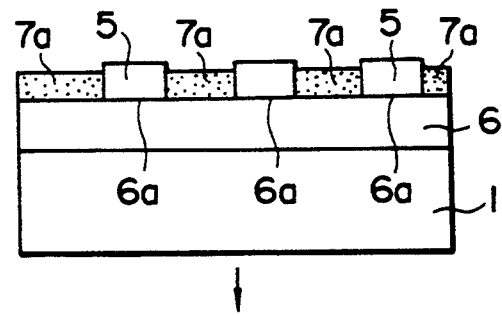

(2) Next, amorphous silicon 7 is deposited over the entire surfaces of the basal thin diamond film 6 and photoresist layers 2 as shown in FIG. 2(b).

(3) The photoresist layers 2 are lifted. At this time, the amorphous silicon 7 deposited on the photoresist layers 2 are also removed. As a result, coating layers 7a made of the amorphous silicon 7 are formed on the basal thin diamond film 6 in the surface areas 6b other than the surface areas 6a where diamonds are to be formed newly [FIG. 2(c)].

Figure 2E:
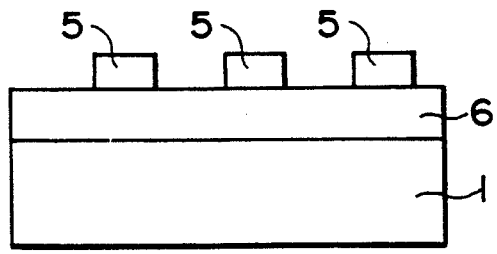

(4) Using a microwave plasma CVD apparatus, gas phase synthesis is thereafter conducted for 7 hours while maintaining the silicon substrate 1 at about 800° C. As a result, without deformation of the coating layers 7a, thin diamond films 5 of 1.5 μm thick are formed in a pattern conforming with the intended surface portions 6a on the basal thin diamond film 6 [FIG. 2(d)]. Thereafter, as shown in FIG. 2(e), the coating layers 7a are eliminated by an aqueous solution of fluoronitric acid.

EXAMPLE 3

A third embodiment of the process of the present invention will now be described with reference to FIG. 3(a) to 3(e). Similarly to the embodiment of Example 2, a basal thin diamond film 6 is deposited beforehand to a thickness of 5 μm on a silicon substrate 1. The present embodiment will hereinafter be described in the order of the steps thereof.

Figure 3A:
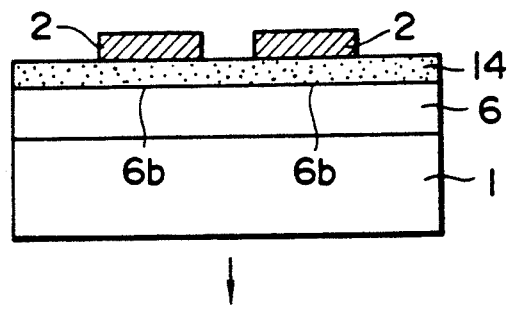
FIGS. 3(a) to 3(e) schematically show various steps of a third embodiment of the process according to the present invention and partly fabricated products, in the order of the steps which are conducted as indicated by arrows.

(1) After forming a coating layer 14 of amorphous Si to a thickness of several hundreds angstroms over the entire upper surface of the basal thin diamond film 6, the coating layer 14 is covered with photoresist layers 2 by a lithographic technique in the areas corresponding to surface portions 6b of the basal thin diamond layer 6, said surface portions 6b being other than surface portions 6a where the diamond film is to be deposited newly [FIG. 3(a)].

Figure 3B:
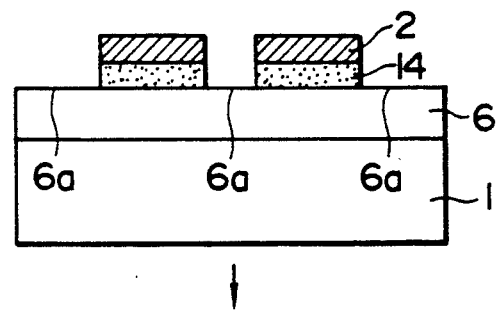
Figure 3C:
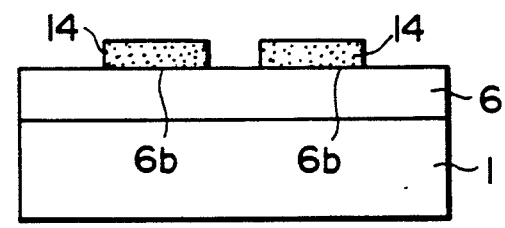
Figure 3D:
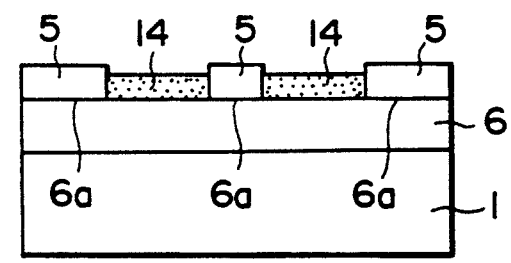
Figure 3E:
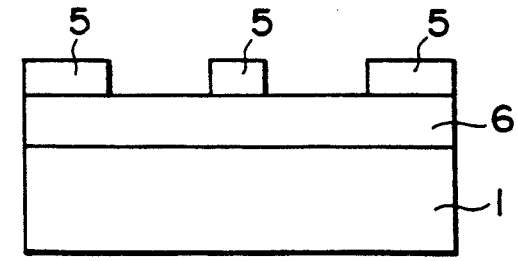
Figure 4A:
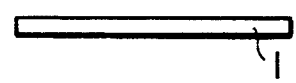
FIGS. 4(a) to 4(c) schematically show various steps of a conventional process for the deposition of diamond on a silicon wafer by gas phase synthesis, which proceed as indicated by arrows.
Figure 4B:
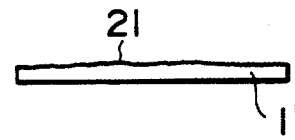
Figure 4C:
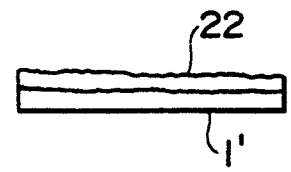

(2) Next, the coating layers 14 are eliminated in the areas not covered by the photoresist layers 2, that is, at the surface portions 6a where diamonds are to be deposited newly [FIG. 3(b)].

(3) The photoresist layers 2 are eliminated. As a consequence, the coating layers 14 made of amorphous silicon are formed in the surface areas 6b of the basal thin diamond film 6, said surface areas 6b being other than the surface areas 6a where diamonds are to be formed newly [FIG. 3(c)].

(4) Next, similarly to the embodiment of Example 2, gas phase synthesis of diamond is conducted using a microwave plasma CVD apparatus. As a result, thin diamond films 5 of 1.5 μm thick are formed in a pattern conforming with the intended surface areas 6a of the basal thin diamond film 6 [FIG. 3(d)]. Thereafter, it is only necessary to eliminate the coating layers 14 by an aqueous solution of fluoronitric acid.

In Examples 2 and 3, amorphous silicon is used as an amorphous material. An amorphous ceramic such as silicon oxide or silicon nitride as well as microcrystalline silicon can also be used instead.

We claim:

1. A process for selective deposition of a second diamond film by gas phase synthesis, by deposition of diamond onto deposition regions of a substrate surface of a substrate at a higher deposition rate than onto non-deposition regions of the substrate surface, comprising the steps of:
    preparing the substrate surface to have a uniform diamond nucleation site density; then
    selectively reducing the density of diamond nucleation sites available for gas phase synthesis in non-deposition regions of the substrate surface, wherein the substrate surface is not a diamond surface and the step of selectively reducing the nucleation site density further comprises the steps of depositing a non-diamond first material which has a low diamond nucleation site density onto the entire substrate surface, removing the first material from the non-deposition regions of the substrate surface, then subjecting the non-deposition regions of the substrate surface to an etch to reduce the density of diamond nucleation sites on the non-deposition region, and then removing the first material from the deposition regions, thereby exposing the high density of diamond nucleation sites of the deposition regions; and then
    exposing the substrate to a gas phase environment suitable for diamond deposition so that diamond is preferentially deposited on the deposition regions and forms said second diamond film.

2. A process according to claim 1, wherein:
    one of the deposition regions and the non-deposition regions has feature sizes which are on the order of a few microns.

3. A process according to claim 1, wherein the gas phase environment is a plasma environment.

4. A process for selective deposition of a second diamond film by gas phase synthesis, by deposition of diamond onto deposition regions of a substrate surface of a substrate at a higher deposition rate than onto non-deposition regions of the substrate surface, comprising the steps of:
    preparing the substrate surface to have a uniform diamond nucleation site density; then
    depositing a non-diamond first material on the diamond substrate surface; and
    removing the first material from the deposition regions of the diamond substrate surface; and then
    exposing the substrate to a gas phase environment suitable for diamond deposition so that diamond is preferentially deposited on the deposition regions and forms said second diamond film; and
    wherein the substrate surface of the substrate is a flat surface, and deposition and non-deposition regions of the substrate surface are in the same plane.

5. A process according to claim 4, wherein:
    an average grain size of the second diamond film is larger than an average grain size of the diamond substrate surface.

6. A process according to claim 4, wherein:
    the first material comprises a member of the group consisting of silicon nitrides, silicon dioxide, amorphous silicon and microcrystalline silicon.

7. A process according to claim 6, wherein the first material comprises amorphous silicon.

8. A process according to claim 4, wherein: the first material comprises an amorphous ceramic.

9. A process according to claim 4, wherein:
    the first material is a material which does not melt or deteriorate at temperatures below a several hundred degrees centigrade.

10. A process according to claim 4, wherein the diamond substrate surface is a single crystal diamond surface and the second diamond layer is homo-epitaxial with the substrate surface.

11. A process according to claim 4, wherein the gas phase environment is a plasma environment.

* * * * *